US011039169B2

(12) United States Patent
Kim et al.

(10) Patent No.: US 11,039,169 B2
(45) Date of Patent: *Jun. 15, 2021

(54) GOLOMB-RICE/EG CODING TECHNIQUE FOR CABAC IN HEVC

(71) Applicant: DOLBY INTERNATIONAL AB, Amsterdam (NL)

(72) Inventors: Seung-Hwan Kim, Camas, WA (US); Louis J. Kerofsky, Camas, WA (US); Christopher A. Segall, Camas, WA (US)

(73) Assignee: Dolby International AB, Amsterdam (NL)

(*) Notice: Subject to any disclaimer, the term of this patent is extended or adjusted under 35 U.S.C. 154(b) by 0 days.

This patent is subject to a terminal disclaimer.

(21) Appl. No.: 16/786,517

(22) Filed: Feb. 10, 2020

(65) Prior Publication Data

US 2020/0280741 A1  Sep. 3, 2020

Related U.S. Application Data

(63) Continuation of application No. 16/522,355, filed on Jul. 25, 2019, now Pat. No. 10,582,218, which is a
(Continued)

(51) Int. Cl.
*H04N 19/60* (2014.01)
*H04N 19/70* (2014.01)
(Continued)

(52) U.S. Cl.
CPC .......... *H04N 19/60* (2014.11); *H03M 7/4018* (2013.01); *H03M 7/4075* (2013.01);
(Continued)

(58) Field of Classification Search
None
See application file for complete search history.

(56) References Cited

U.S. PATENT DOCUMENTS 8,730,070 B2  5/2014  Lou
2002/0163965 A1  11/2002  Lee et al.
(Continued)

FOREIGN PATENT DOCUMENTS

CN  1767395  5/2006
CN  101099387  1/2008
(Continued)

OTHER PUBLICATIONS

T. Nguyen, et al., Reduced-complexity entropy coding of transform coefficient levels using a combination of VLC and PIPE, Input Document, Joint Collaborative Team on Video Coding (JCT-VC) of ITU-T SG16 WP3 and ISO/IEC JTC1/SC29/WG11 Doc. No. JCTVC-D336 (Jan. 21, 2011) (Year: 2011).*

(Continued)

*Primary Examiner* — Lindsay J Uhl

(57) ABSTRACT

A system utilizing a high throughput coding mode for CABAC in HEVC is described. The system may include an electronic device configured to obtain a block of data to be encoded using an arithmetic based encoder; to generate a sequence of syntax elements using the obtained block; to compare an Absolute-3 value of the sequence or a parameter associated with the Absolute-3 value to a preset value; and to convert the Absolute-3 value to a codeword using a first code or a second code that is different than the first code, according to a result of the comparison.

5 Claims, 20 Drawing Sheets

Related U.S. Application Data continuation of application No. 15/662,791, filed on Jul. 28, 2017, now Pat. No. 10,412,416, which is a continuation of application No. 14/391,422, filed as application No. PCT/JP2013/002492 on Apr. 11, 2013, now Pat. No. 9,749,656.

(60) Provisional application No. 61/622,990, filed on Apr. 11, 2012.

(51) Int. Cl.
*H04N 19/44* (2014.01)
*H04N 19/91* (2014.01)
*H03M 7/40* (2006.01)

(52) U.S. Cl.
CPC ............. *H04N 19/44* (2014.11); *H04N 19/70* (2014.11); *H04N 19/91* (2014.11)

(56) References Cited

U.S. PATENT DOCUMENTS

| | | | |
|---|---|---|---|
| 2006/0233240 | A1 | 10/2006 | Cha et al. |
| 2008/0253460 | A1* | 10/2008 | Lin .................. H03M 7/40 375/240.23 |
| 2010/0284613 | A1 | 11/2010 | Tsai et al. |
| 2011/0158323 | A1 | 6/2011 | Chen et al. |
| 2012/0014454 | A1 | 1/2012 | Budagavi et al. |
| 2013/0188729 | A1* | 7/2013 | Lou .................. H04N 19/18 375/240.18 |

FOREIGN PATENT DOCUMENTS

| | | |
|---|---|---|
| CN | 101267553 | 9/2008 |
| CN | 101800898 | 8/2010 |
| CN | 102186087 | 9/2011 |
| CN | 102256125 | 11/2011 |
| JP | 2011035682 | 2/2011 |

OTHER PUBLICATIONS

Official Communication issued in International Patent Application No. PCT/JP2013/002492, dated Jul. 16, 2013.

International Search Report and Written Opinion in International Application No. PCT/JP2013/002492, dated Jul. 4, 2013, 9 pages.

Lou et al., "Simplified coeff abs level minus3 coding", Joint Collaborative Team on Video Coding (JCT-VC) of ITU-T SG16 WP3 and ISO/IEC JTC1/SC29/WG11 8th Meeting, Feb. 1-10, 2012, pp. 1-14.

Guo et al., "CABAC Contexts Reduction for Last Position Coding," Joint Collaborative Team on Video Coding (JCT-VC) of ITU-T SG16 WP3 and ISO/IEC JTC1/SC29/WG11 8th Meeting: San Jose, Feb. 1-10, 2012, [JCTVC-H0537].

Nguyen, Tung et al., Reduced-Complexity Entropy Coding of Transform Coefficient Levels Using Truncated Golomb-Rice Codes in Video Compression, 2011 18th IEEE International Conference on Image Processing, pp. 753-756, Sep. 2011.

N. Memon, Adaptive coding of DCT coefficients by Golomb-Rice codes, pp. 516-520, IEEE, 1998.

T. Nguyen, et al., Reduced Complexity Entropy Coding of Transform Coefficient Levels Using a Combination of VLC and PIPE, Input Document, Joint Collaborative Team on Video Coding (JCT-VC) of ITU-T of ITU-T SG16 WP3 and ISO/IEC JCT1/SC29/WG11, Document JCTVC-D336, Jan. 21, 2011.

Chinese Office Action in Chinese Application No. 201810180879.0, dated Nov. 14, 2019, 22 pages (with English translation).

Chinese Office Action in Chinese Application No. 201810180894.5, dated Nov. 18, 2019, 20 pages (with English translation).

Chinese Office Action in Chinese Application No. 201810180885.6, dated Nov. 18, 2019, 17 pages (with English translation).

Chinese Office Action in Chinese Application No. 201810180891.1, dated Nov. 18, 2019, 17 pages (with English translation).

Bross et al., "High Efficiency Video Coding (HEVC) text specification draft 6," JCTVC-H1003_dG, Joint Collaborative Team on Video Coding (JCT-VC) of ITU-T SG16 WP3 and ISO/IEC JTC1/SC29/WG11, 7th Meeting: Geneva, CH, Nov. 21-30, 2011, 269 pages.

\* cited by examiner

FIG. 1 (background)

*Coefficients are coded in reverse scanning order
(background)

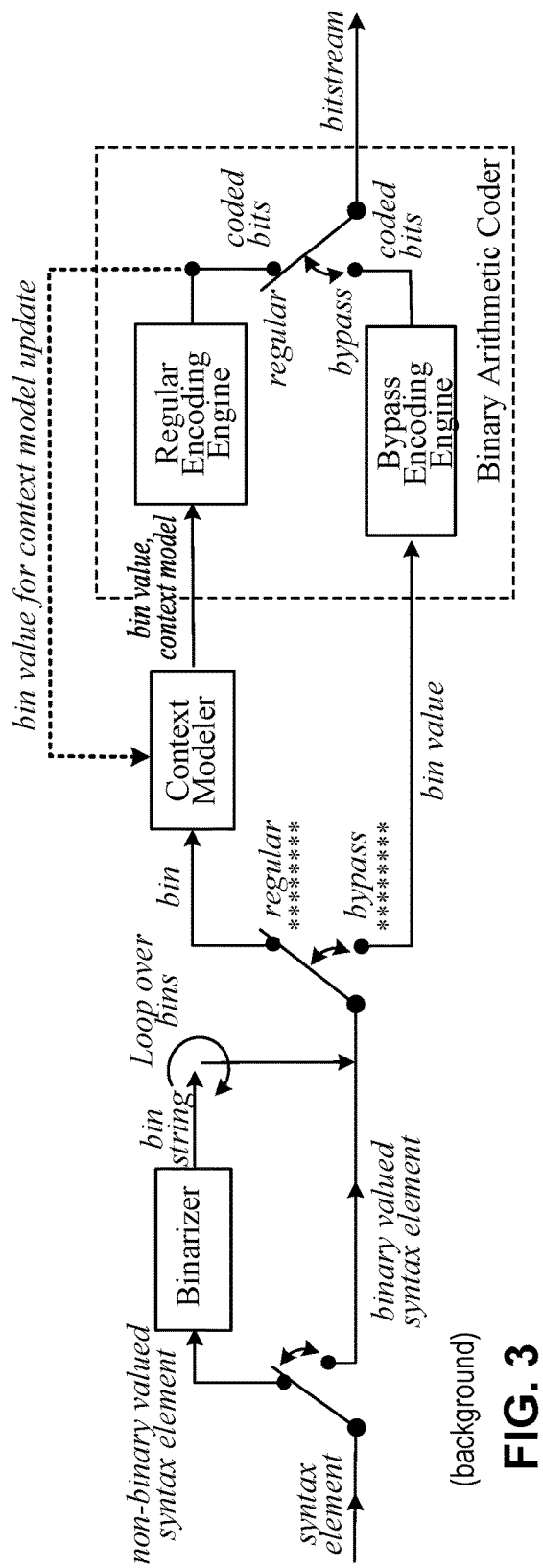
FIG. 3 (background)
FIG. 4 (background)

| Rice Parameter | 0 | | 1 | | 2 | | 3 | | 4 | |
|---|---|---|---|---|---|---|---|---|---|---|
| Input symbol | codeword | | codeword | | codeword | | codeword | | codeword | |
| 0 | 0 | | 00 | | 000 | | 0000 | | 00000 | |
| 1 | 10 | | 01 | | 001 | | 0001 | | 00001 | |
| 2 | 110 | | 100 | | 010 | | 0010 | | 00010 | |
| 3 | 1110 | | 101 | | 011 | | 0011 | | 00011 | |
| 4 | 11110 | | 1100 | | 1000 | | 0100 | | 00100 | |
| ... | ... | | ... | | ... | | ... | | ... | |
| 8 | 11111111 | | 11100 | | 11000 | | 10000 | | 01000 | |
| ... | | | ... | | ... | | ... | | ... | |
| 15 | | | 11111111 | | 11011 | | 10111 | | 01111 | |
| ... | | | | | ... | | ... | | ... | |
| 27 | | | | | 11111111 | | 110011 | | 101011 | |
| ... | | | | | | | ... | | ... | |
| 47 | | | | | | | 11111111 | | 110111 | |
| ... | | | | | | | | | ... | |
| 79 | | | | | | | | | 11111111 | |

(background)
FIG. 5

| Rice Parameter \ Symbol | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 0 | 0 | 0 | 1 | 1 | 1 | 2 | 2 | 2 | 2 | 2 | 2 | 3 | 3 | 3 | 3 | 3 | 3 | 3 | 3 | 3 | 3 | 3 | 4 |
| 1 | 1 | 1 | 1 | 1 | 1 | 1 | 2 | 2 | 2 | 2 | 2 | 2 | 3 | 3 | 3 | 3 | 3 | 3 | 3 | 3 | 3 | 3 | 3 | 4 |
| 2 | 2 | 2 | 2 | 2 | 2 | 2 | 2 | 2 | 2 | 2 | 2 | 2 | 3 | 3 | 3 | 3 | 3 | 3 | 3 | 3 | 3 | 3 | 3 | 4 |
| 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 4 |
| 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 |

FIG. 6 (background)

| Input symbol (Value) | Input symbol | Prefix | Suffix | | Total length of code words | Number of code words | Cumulative number of code words |
|---|---|---|---|---|---|---|---|
| 0 | 0 | | 0 | | 1 | $2^0$ | $2^0$ |
| 1, 2 | $2^1-1 \sim 2^2-2$ | 1 | 0 | X | 3 | $2^1$ | $2^2-1$ |
| 3~6 | $2^2-1 \sim 2^3-2$ | 11 | 0 | XX | 5 | $2^2$ | $2^3-1$ |
| 7~14 | $2^3-1 \sim 2^4-2$ | 111 | 0 | XXX | 7 | $2^3$ | $2^4-1$ |
| 15~30 | $2^4-1 \sim 2^5-2$ | 1111 | 0 | XXXX | 9 | $2^4$ | $2^5-1$ |
| 31~62 | $2^5-1 \sim 2^6-2$ | 11111 | 0 | XXXXX | 11 | $2^5$ | $2^6-1$ |
| 63~126 | $2^6-1 \sim 2^7-2$ | 111111 | 0 | XXXXXX | 13 | $2^6$ | $2^7-1$ |
| 127~254 | $2^7-1 \sim 2^8-2$ | 1111111 | 0 | XXXXXXX | 15 | $2^7$ | $2^8-1$ |
| 255~510 | $2^8-1 \sim 2^9-2$ | 11111111 | 0 | XXXXXXXX | 17 | $2^8$ | $2^9-1$ |
| 511~1022 | $2^9-1 \sim 2^{10}-2$ | 111111111 | 0 | XXXXXXXXX | 19 | $2^9$ | $2^{10}-1$ |
| 1023~2046 | $2^{10}-1 \sim 2^{11}-2$ | 1111111111 | 0 | XXXXXXXXXX | 21 | $2^{10}$ | $2^{11}-1$ |
| 2047~4094 | $2^{11}-1 \sim 2^{12}-2$ | 11111111111 | 0 | XXXXXXXXXXX | 23 | $2^{11}$ | $2^{12}-1$ |
| 4095~8190 | $2^{12}-1 \sim 2^{13}-2$ | 111111111111 | 0 | XXXXXXXXXXXX | 25 | $2^{12}$ | $2^{13}-1$ |
| 8191~16382 | $2^{13}-1 \sim 2^{14}-2$ | 1111111111111 | 0 | XXXXXXXXXXXXX | 27 | $2^{13}$ | $2^{14}-1$ |
| 16383~32766 | $2^{14}-1 \sim 2^{15}-2$ | 11111111111111 | 0 | XXXXXXXXXXXXXX | 29 | $2^{14}$ | $2^{15}-1$ |

(background)

FIG. 7

| Input symbol (Value) | Input symbol | Prefix | Suffix | | Total Length of Code words | Number of code words | Cumulative number of code words |
|---|---|---|---|---|---|---|---|
| 0 | 0 | | | 0 | 1 | $2^0$ | $2^0$ |
| 1,2 | $2^1-1 \sim 2^2-2$ | 1 | 0 | x | 3 | $2^1$ | $2^2-1$ |
| 3~6 | $2^2-1 \sim 2^3-2$ | 11 | 0 | xx | 5 | $2^2$ | $2^3-1$ |
| 7~14 | $2^3-1 \sim 2^4-2$ | 111 | 0 | xxx | 7 | $2^3$ | $2^4-1$ |
| 15~30 | $2^4-1 \sim 2^5-2$ | 1111 | 0 | xxxx | 9 | $2^4$ | $2^5-1$ |
| 31~62 | $2^5-1 \sim 2^6-2$ | 11111 | 0 | xxxxx | 11 | $2^5$ | $2^6-1$ |
| 63~126 | $2^6-1 \sim 2^7-2$ | 111111 | 0 | xxxxxx | 13 | $2^6$ | $2^7-1$ |
| 127~254 | $2^7-1 \sim 2^8-2$ | 1111111 | 0 | xxxxxxx | 15 | $2^7$ | $2^8-1$ |
| 255~33022 | $2^8-1 \sim 2^{15}+2^8-2$ | 11111111 | 0 | xxxxxxxxxxxxxxx | 24 | $2^{15}$ | $2^{15}+2^8-1$ |

FIG. 10

Content model selection table for Pos_X — 1610

| Bin index | 0 | 1 | 2 | 3 | 4 | 5 | 6 | 7 | 8 |
|---|---|---|---|---|---|---|---|---|---|
| TU 4 | $0_1$ | $1_1$ | $2_1$ | | | | | | |
| TU 8 | $3_1$ | $4_1$ | $5_1$ | $5_1$ | $2_1$ | | | | |
| TU 16 | $6_1$ | $7_1$ | $8_1$ | $8_1$ | $9_1$ | $9_1$ | $2_1$ | | |
| TU 32 | $10_1$ | $11_1$ | $12_1$ | $12_1$ | $13_1$ | $13_1$ | $14_1$ | $14_1$ | $2_1$ |

Content model selection table for Pos_Y — 1611

| Bin index | 0 | 1 | 2 | 3 | 4 | 5 | 6 | 7 | 8 |
|---|---|---|---|---|---|---|---|---|---|
| TU 4 | $0_2$ | $1_2$ | $2_2$ | | | | | | |
| TU 8 | $3_2$ | $4_2$ | $5_2$ | $5_2$ | $2_2$ | | | | |
| TU 16 | $6_2$ | $7_2$ | $8_2$ | $8_2$ | $9_2$ | $9_2$ | $2_2$ | | |
| TU 32 | $10_2$ | $11_2$ | $12_2$ | $12_2$ | $13_2$ | $13_2$ | $14_2$ | $14_2$ | $2_2$ |

FIG. 16

Content model selection table for Pos_X — 1810

| Bin index | 0 | 1 | 2 | 3 | 4 | 5 | 6 | 7 | 8 |
|---|---|---|---|---|---|---|---|---|---|
| TU 4 | $0_1$ | $1_1$ | $2_1$ | | | | | | |
| TU 8 | $3_1$ | $4_1$ | $5_1$ | $5_1$ | $2_1$ | | | | |
| TU 16 | $6_1$ | $7_1$ | $8_1$ | $8_1$ | $9_1$ | $9_1$ | $2_1$ | | |
| TU 32 | $10_1$ | $11_1$ | $12_1$ | $12_1$ | $13_1$ | $13_1$ | $14_1$ | $14_1$ | $2_1$ |

Content model selection table for Pos_Y — 1811

| Bin index | 0 | 1 | 2 | 3 | 4 | 5 | 6 | 7 | 8 |
|---|---|---|---|---|---|---|---|---|---|
| TU 4 | $0_2$ | $1_2$ | $2_2$ | | | | | | |
| TU 8 | $3_2$ | $4_2$ | $5_2$ | $5_2$ | $2_2$ | | | | |
| TU 16 | $6_1$ | $7_1$ | $8_1$ | $8_1$ | $9_1$ | $9_1$ | $2_1$ | | |
| TU 32 | $10_1$ | $11_1$ | $12_1$ | $12_1$ | $13_1$ | $13_1$ | $14_1$ | $14_1$ | $2_1$ |

FIG. 18

Content model selection table for Pos_X — 2010

| Bin index | 0 | 1 | 2 | 3 | 4 | 5 | 6 | 7 | 8 |
|---|---|---|---|---|---|---|---|---|---|
| TU 4 | $0_1$ | $1_1$ | $2_1$ | | | | | | |
| TU 8 | $3_1$ | $4_1$ | $5_1$ | $5_1$ | $2$ | | | | |
| TU 16 | $6_1$ | $7_1$ | $8_1$ | $8_1$ | $9_1$ | $9_1$ | $2_1$ | | |
| TU 32 | $10_1$ | $11_1$ | $12_1$ | $12_1$ | $13_1$ | $13_1$ | $14_1$ | $14_1$ | $2_1$ |

Content model selection table for Pos_Y — 2011

| Bin index | 0 | 1 | 2 | 3 | 4 | 5 | 6 | 7 | 8 |
|---|---|---|---|---|---|---|---|---|---|
| TU 4 | $0_1$ | $1_1$ | $2_1$ | | | | | | |
| TU 8 | $3_1$ | $4_1$ | $5_1$ | $5_1$ | $2_1$ | | | | |
| TU 16 | $6_1$ | $7_1$ | $8_1$ | $8_1$ | $9_1$ | $9_1$ | $2_1$ | | |
| TU 32 | $10_1$ | $11_1$ | $12_1$ | $12_1$ | $13_1$ | $13_1$ | $14_1$ | $14_1$ | $2_1$ |

FIG. 20

GOLOMB-RICE/EG CODING TECHNIQUE FOR CABAC IN HEVC

CROSS-REFERENCE TO RELATED APPLICATION

This application is a continuation U.S. application Ser. No. 16/522,355, filed Jul. 25, 2019, which is a continuation of U.S. application Ser. No. 15/662,791, filed Jul. 28, 2017, now U.S. Pat. No. 10,412,416, which is a continuation of U.S. application Ser. No. 14/391,422, filed Oct. 9, 2014, now U.S. Pat. No. 9,749,656, which is a 371 of International Application No. PCT/JP2013/002492, filed on Apr. 11, 2013, which claims the benefit of U.S. Provisional Application No. 61/622,990, filed on Apr. 11, 2012. The contents of each of these applications are incorporated by reference.

TECHNICAL FIELD

The present disclosure relates generally to electronic devices. More specifically, the present disclosure relates to electronic devices utilizing enhanced Context Adaptive Binary Arithmetic Coding (CABAC) for encoding and/or decoding.

BACKGROUND ART

Many decoders (and encoders) receive (and encoders provide) encoded data for blocks of an image. Typically, the image is divided into blocks and each of the blocks is encoded in some manner, such as using a discrete cosine transform (DCT), and provided to the decoder. A block may denote a rectangular region in an image and consist of pixels, for example a 16.times.16 block is a region 16 pixels in width by 16 pixels in height. The decoder receives the encoded blocks and decodes each of the blocks in some manner, such as using an inverse DCT.

Video coding standards, such as MPEG-4 part 10 (H.264), compress video data for transmission over a channel with limited bandwidth and/or limited storage capacity. These video coding standards include multiple coding stages such as intra prediction, transform from spatial domain to frequency domain, inverse transform from frequency domain to spatial domain, quantization, entropy coding, motion estimation, and motion compensation, in order to more effectively encode and decode frames.

The Joint Collaborative Team on Video Coding (JCT-VC) of the International Telecommunication Union Telecommunication Standardization Sector (ITU-T) Study Group 16 (SG16) Working Party 3 (WP3) and International Organization for Standardization/International Electrotechnical Commission (ISO/IEC) Joint Technical Committee 1/Subcommittee 29/Working Group 11 (JTC1/SC29/WG11) has launched a standardization effort for a video coding standard called the High Efficiency Video Coding standard (HEVC). Similar to some prior video coding standards, HEVC uses block-based coding. An example of a known HEVC encoder is shown in FIG. 1. HEVC decoders are also known.

In HEVC, Context-Adaptive Binary Arithmetic Coding (CABAC) is used to compress Transformed and Quantized Coefficients (TQCs) without loss. The TQCs are determined at the encoder by processing image blocks with a forward transform to generate transform coefficients that are then quantized using an operation that maps multiple transform coefficient values to TQCs values. The TQCs values are then communicated to the decoder as coefficient level values, or level values, and the level value for each coefficient is then mapped to a transform coefficient value that is similar, but not necessarily identical, to the transform coefficient value computed at the encoder. CABAC based encoding and/or decoding technique is generally context adaptive which refers to (i) adaptively coding symbols based on the values of previous symbols encoded and/or decoded in the past, and (ii) context, which identifies the set of symbols encoded and/or decoded in the past used for adaptation. The past symbols may be located in spatial and/or temporal adjacent blocks. In many cases, the context is based upon symbol values of neighboring blocks.

As mentioned above, CABAC may be used to compress TQCs without loss. By way of background, TQCs may be from different block sizes according to transform sizes (e.g., 4.times.4, 8.times.8, 16.times.16, 32.times.32, 16.times.32). Two-dimensional (2D) TQCs may be converted into a one-dimensional (1D) array before entropy coding, for example, CABAC. In an example, 2D arrayed TQCs in a 4.times.4 block may be arranged as illustrated in Table (1).

TABLE 1

| 4 | 0 | 1 | 0 |
|---|---|---|---|
| 3 | 2 | −1 | ... |
| −3 | 0 | ... | ... |
| 0 | ... | ... | ... |

When converting the 2D TQCs into a 1D array, the block may be scanned in a diagonal zig-zag fashion. Continuing with the example, the 2D arrayed TQCs illustrated in Table (1) may be converted into 1D arrayed TQCs [4, 0, 3, −3, 2, 1, 0, −1, 0, 0, . . . ] by scanning the first row and first column, first row and second column, second row and first column, third row and first column, second row and second column, first row and third column, first row and fourth column, second row and third column, third row and second column, fourth row and first column and so on.

The 1D array of TQCs is represented by a sequence of Syntax Elements (SEs) in CABAC. An example of the sequence of SEs for the example 1D array of TQCs is shown in FIG. 2. The SEs represent the following parameters: Last position X/Y, Significance Map, and the attributes Greater than 1, Greater than 2, Sign Information, and Absolute-3. The last position X/Y represents the position (X/Y) of the last non-zero coefficient in the corresponding block. Significance map represents the significance of each coefficient, whether the coefficient level is zero. Greater than 1 indicates whether the coefficient amplitude (absolute coefficient level) is larger than one for each non-zero coefficient (i.e. with significant flag (map) as 1). Greater than 2 indicates whether the coefficient amplitude is larger than two for each coefficient with amplitude larger than one (i.e. with greater than 1 flag as 1).

In CABAC in HEVC, the representative SEs are coded. FIG. 3 shows the CABAC framework used for coding SEs. The CABAC coding technique includes coding symbols using stages. In the first stage, the CABAC uses a "binarizer" to map input symbols to a string of binary symbols, or "bins". The input symbol may be a non-binary valued symbol that is binarized or otherwise converted into a string of binary (1 or 0) symbols prior to being coded into bits. The bins can be coded into bits using either a "bypass encoding engine" or a "regular encoding engine".

For the regular encoding engine in CABAC, in the second stage a probability model is selected. The probability model is used to arithmetic encode one or more bins of the binarized input symbols. This model may be selected from a list of available probability models depending on the context, which is a function of recently encoded symbols. The probability model stores the probability of a bin being "1" or "0". In the third stage, an arithmetic encoder encodes each bin according to the selected probability model. There are two sub-ranges for each bin, corresponding to a "0" and a "1". The fourth stage involves updating the probability model. The selected probability model is updated based on the actual encoded bin value (e.g., if the bin value was a "1", the frequency count of the "1" s is increased). The decoding technique for CABAC decoding reverses the process.

For the bypass encoding engine in CABAC, the second stage involves conversion of bins to bits omitting the computationally expensive context estimation and probability update stages. The bypass encoding engine assumes an equal probability distribution for the input bins. The decoding technique for CABAC decoding reverses the process.

The CABAC encodes the symbols conceptually using two steps. In the first step, the CABAC performs a binarization of the input symbols to bins. In the second step, the CABAC performs a conversion of the bins to bits using either the bypass encoding engine or the regular encoding engine. The resulting encoded bit values are provided in the bitstream to a decoder.

The CABAC decodes the symbols conceptually using two steps. In the first step, the CABAC uses either the bypass decoding engine or the regular decoding engine to convert the input bits to bin values. In the second step, the CABAC performs de-binarization to recover the transmitted symbol value for the bin values. The recovered symbol may be non-binary in nature. The recovered symbol value is used in remaining aspects of the decoder.

As previously described, the encoding and/or decoding process of the CABAC includes at least two different modes of operation. In a first mode, the probability model is updated based upon the actual coded bin value, generally referred to as a "regular coding mode". The regular coding mode requires several sequential serial operations together with its associated computational complexity and significant time to complete. In a second mode, the probability model is not updated based upon the actual coded bin value, generally referred to as a "bypass coding mode". In the second mode, there is no probability model (other than perhaps a fixed probability) for decoding the bins, and accordingly there is no need to update the probability model.

When utilizing CABAC coding in HEVC, throughput performance can differ depending on different factors such as but not limited to: total number of bins/pixels, number of bypass bins/pixels, and number of regular (or context) coded bins/pixels. Throughput is defined as the amount of TQCs that can be decoded (or encoded) in a unit of time. Generally speaking, throughput for the case of high bit-rate encoding (low Quantization Parameter (QP) value) is significantly less than throughput in other cases. Therefore, throughput in high bit-rate cases may consume a significant amount of processing resources and/or may take a significant amount of time to encode/decode. The disclosure that follows solves this and other problems.

It is also known that CABAC can be used in a lossless coding mode to compress a residual sample. In one example, a residual sample is a value corresponding to a specific location in an image. Typically, a residual sample corresponds to the difference between a value corresponding to a specific location in an image and a prediction value corresponding to the same, specific location in an image. Alternatively, a residual sample is a value corresponding to a specific location in an image that has not been processed with a transformation operation, or a transformation operation that is not typically used to create TQCs. A residual sample can be from different block sizes according to its sample size (4.times.4, 8.times.8, 16.times.16, 32.times.32, 16.times.32, etc.) A 2D residual sample block is first converted into a 1D array before entropy coding, similar to TQC encoding. In an example, 2D arrayed residual sample in a 4.times.4 block may be arranged as illustrated in Table (2).

TABLE 2

| 4  | 0 | 1  | 0 |
|----|---|----|---|
| 3  | 2 | −1 | ... |
| −3 | 0 | ... | ... |
| 0  | ... | ... | ... |

When converting the 2D residual sample into a 1D array, the block may be scanned in a diagonal zig-zag fashion. Continuing with the example, the 2D arrayed residual sample illustrated in Table (2) may be converted into 1D arrayed residual sample [4, 0, 3, −3, 2, 1, 0, −1, 0, 0, . . . ] by scanning the first row and first column, first row and second column, second row and first column, third row and first column, second row and second column, first row and third column, first row and fourth column, second row and third column, third row and second column, fourth row and first column and so on.

The 1D array of the residual sample is represented by a sequence of Syntax Elements (SEs) in CABAC. An example of a sequence of SEs for the example 1D array of the residual sample is shown in FIG. 2. The SEs represent the following parameters: Last position X/Y, Significance Map, and the attributes Greater than 1, Greater than 2, Sign Information, and Absolute-3.

In the lossless coding mode of CABAC in HEVC, the representative SEs are coded. The CABAC framework of FIG. 3 may be used for coding the SEs. The CABAC coding technique includes coding symbols using stages. In the first stage, the CABAC uses a "binarizer" to map input symbols to a string of binary symbols, or "bins". The input symbol may be a non-binary valued symbol that is binarized or otherwise converted into a string of binary (1 or 0) symbols prior to being coded into bits. The bins can be coded into bits using the previously described "regular encoding engine".

For the regular encoding engine in the lossless coding mode of CABAC, in the second stage a probability model (also known as a "context model" in the lossless encoding mode of CABAC) is selected. The context model is used to arithmetic encode one or more bins of the binarized input symbols. This context model may be selected from a list of available context models depending on the context, which is a function of recently encoded symbols. The context model stores the probability of a bin being "1" or "0". In the third stage, an arithmetic encoder encodes each bin according to the selected context model. There are two sub-ranges for each bin, corresponding to a "0" and a "1". The fourth stage involves updating the corresponding context model. The selected context model is updated based on the actual encoded bin value (e.g., if the bin value was a "1", the frequency count of the "1" s is increased). The decoding technique for CABAC decoding reverses the process.

The number of context models used as described in the previous paragraph may be 184. Specifically: 36 context models used for Last position X/Y (18 context models for Last_position_X, 18 context models for Last_position_Y); 48 context models used for Significance Map (4.times.4 block: 9 luma, 6 chroma; 8.times.8 block: 11 luma, 11 chroma; 16.times.16 or 32.times.32 block: 7 luma, 4 chroma); and 100 context models used for the attributes Greater than 1, Greater than 2, Sign Information, and Absolute-3 (Greater_than.sub.--1 flag of luma: 30; Greater_than.sub.--1 flag of chroma: 20, Greater_than.sub.--2 flag of luma: 30; and Greater_than.sub.--2 flag of chroma: 20).

(Coding Absolute-3 Coefficients of the Syntax Element)

Referring back to syntax element coding, a portion of the syntax element coding involves coding the Absolute-3 coefficients of the syntax element. Coding the Absolute-3 coefficients involves Golomb-Rice (GR) coding and 0.sup.th order Exponential-Golomb (EG0) coding, as will be explained in more detail below.

FIG. 4 illustrates coding structure for Absolute-3 for HEVC.

By way of example, consider the Absolute-3 values shown in FIG. 4, namely, 81, 34, 6, 4, 0. Coding is in reverse relative to scanning order. The value "0" is converted using the Golomb-Rice (G-R) code table illustrated in FIG. 5, which shows five Variable-Length Code (VLC) tables (denoted as with the columns labeled 0-4, where column labeled 0 is VLC table 0, column labeled 1 is VLC table 1, ..., column labeled 4 is VLC table 4), each corresponding to a different Rice parameter value. Based on a current Rice parameter of zero (Rice parameter is initialized at zero for the initial value of a sub-block in HEVC), VLC table 0 is activated. In the VLC table 0, for the input value of "0", the codeword is "0". Therefore, the corresponding codeword value is "0".

Before proceeding to the next scanning position, there is a check for a Rice parameter update. A Rice parameter update table is illustrated in FIG. 6. Because the input symbol level is "0", and current Rice parameter zero is "0", a lookup result is zero, the same as the current Rice parameter value, and hence there is no Rice parameter update. A Rice parameter update determines the Rice parameter value used to code a next value.

The next value "4" is converted using VLC table 0 of the G-R code table of FIG. 5 to codeword 11110. According to the update table illustrated in FIG. 6, the current Rice parameter is updated to one before converting the next value "6" to a codeword. Following the conversion of the value "6" to a codeword, the Rice parameter is updated to two according to FIG. 6.

Moving to scanning position two, it can be seen that the value "34" to convert is larger than the Rice code range corresponding to the current Rice parameter two. Specifically, the five Rice parameter values shown in FIG. 5 have, respectively, the following Rice code ranges: 7, 14, 26, 46, 78. The range corresponds to the largest symbol value with a defined codeword and not equal to Ser. No. 11/111,111 for each Rice parameter. Again, the value "34" is larger than the corresponding range 26. Therefore, according to HEVC, a codeword corresponding to the value 27 is selected using the VLC table 2 of FIG. 5.

Also, EG0 coding is used to encode the residual value that is not represented by the corresponding codeword (11111111 for value 27) from G-R coding. The input value of the residual, namely 8 (34-26), is used to select a prefix and suffix from the EG0 table of FIG. 7. Here, the selected prefix from the EG0 process is 1110 and the selected suffix from the EG0 process is 001. The Rice parameter is updated to four based on the value 26 (4 is the lookup result for the largest value 23) and according to FIG. 6. Both the codeword 11111111 (from G-R coding) and the codeword 1110001 (from EG0 coding) are used to represent the value "34". In an example, the codeword from G-R coding and the codeword from EG0 coding are concatenated to form a single codeword.

When utilizing CABAC coding in HEVC, throughput performance can differ depending on different factors such as but not limited to the magnitude of the Absolute-3 values of a syntax element to be coded. Therefore, depending on these factors, coding may consume a significant amount of processing resources and/or may take a significant amount of time. The disclosure that follows solves this and other problems.

SUMMARY OF INVENTION

One embodiment of the present invention discloses a method for decoding a bitstream associated with transform coefficients comprising the steps of: (a) obtaining a bitstream; (b) decoding binary data associated with target transform coefficient from the obtained bitstream by using an arithmetic decoding; (c) deriving a rice parameter for said target transform coefficient; and (d) converting said binary data to a parameter associated with magnitude of said target transform coefficient based on k-th order Exp-Golomb coding.

Another embodiment of the present invention discloses a method for encoding data associated with transform coefficients comprising the steps of: (a) obtaining data of target transform coefficient to be encoded using an arithmetic encoding; (b) generating a parameter associated with magnitude of target transform coefficient using the obtained data; (c) deriving a rice parameter for said target transform coefficient; (d) converting said parameter to binary data associated with magnitude of said target transform coefficient based on k-th order Exp-Golomb coding; and (e) encoding said binary data using said arithmetic encoding.

Another embodiment of the present invention discloses a system, comprising: an electronic device of an encoder, the electronic device configured to: obtain a block of data to be encoded using an arithmetic based encoder; generate a sequence of syntax elements using the obtained block; compare an Absolute-3 value of the sequence or a parameter associated with the Absolute-3 value to a preset value; convert the Absolute-3 value to a codeword using a first code or a second code that is different than the first code, according to a result of the comparison; and cause the codeword to be stored in a memory device.

Another embodiment of the present invention discloses a system, comprising: a electronic device of an encoder, the electronic device configured to: obtain a block of data to be encoded using an arithmetic based encoder; generate a sequence of syntax elements using the obtained block; determine whether a preset condition associated with the block size is met; in response to determining that the preset condition associated with the block size is not met, code a binarization of a horizontal last position based on a first subset of context models and code a binarization of a vertical last position based on a second subset of context models that is different than the first subset of context models; in response to determining that the preset condition associated with the block size is met, code the binarization of the horizontal last position based on the first subset of context models and code the binarization of the vertical last position based on the first subset of context models; and cause the coding to be stored in a memory device.

BRIEF DESCRIPTION OF DRAWINGS

FIG. 3 is a block diagram of the CABAC framework for a sequence of syntax elements.

FIG. 4 illustrates coding structure for Absolute-3 for HEVC.

FIG. 5 illustrates a Golomb-Rice code table for HEVC.

FIG. 6 illustrates a Rice Parameter update table for HEVC.

FIG. 7 illustrates an EG0 (0th order Exponential-Golomb) table for HEVC.

FIG. 10 illustrates an example of a truncated EG0 table.

FIG. 16 illustrates context models associated with luma for last position coding in known CABAC.

FIG. 18 illustrates coding tables that may be utilized in an example utilizing the configuration described in FIG. 17.

FIG. 20 illustrates coding tables that may be utilized in an example utilizing the configuration described in FIG. 19.

DESCRIPTION OF EMBODIMENTS

Figure 1:
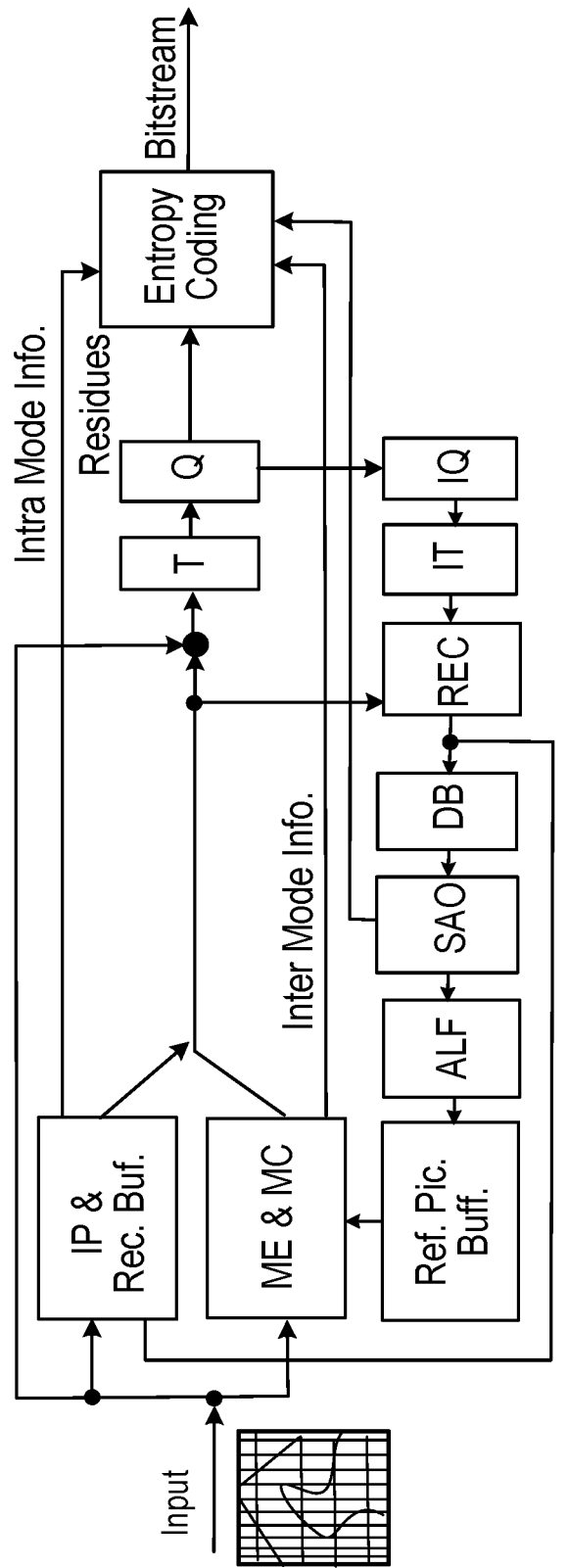
FIG. 1 is a block diagram of an HEVC encoder.
Figure 2:
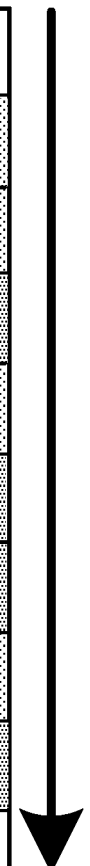
FIG. 2 is a table showing a sequence of syntax elements according to CABAC.
Figure 8:
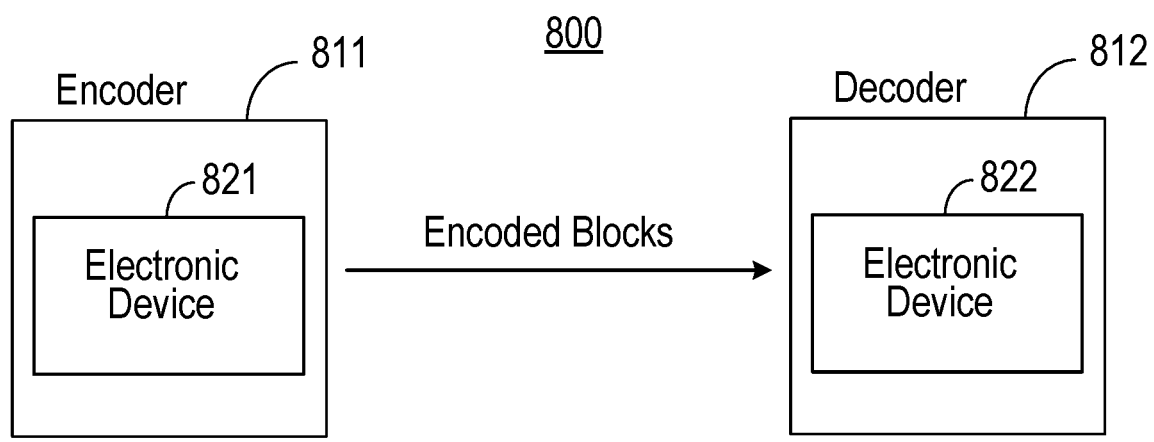
FIG. 8 is a block diagram illustrating an example of an encoder and a decoder.

FIG. 8 is a block diagram illustrating an example of an encoder and a decoder.

The system 800 includes an encoder 811 to generate encoded blocks to be decoded by a decoder 812. The encoder 811 and the decoder 812 may communicate over a network.

The encoder 811 includes an electronic device 821 configured to encode using a Golomb-Rice and/or EG coding based technique. The electronic device 821 may comprise a processor and memory in electronic communication with the processor, where the memory stores instructions being executable by the processor to perform the operations shown in FIGS. 9, 12, and 14.

The decoder 812 includes an electronic device 822 configured to decode using a Golomb-Rice and/or EG coding based technique. The electronic device 822 may comprise a processor and memory in electronic communication with the processor, where the memory stores instructions being executable to perform the operations shown in FIGS. 11, 13, and 15.

Figure 9:
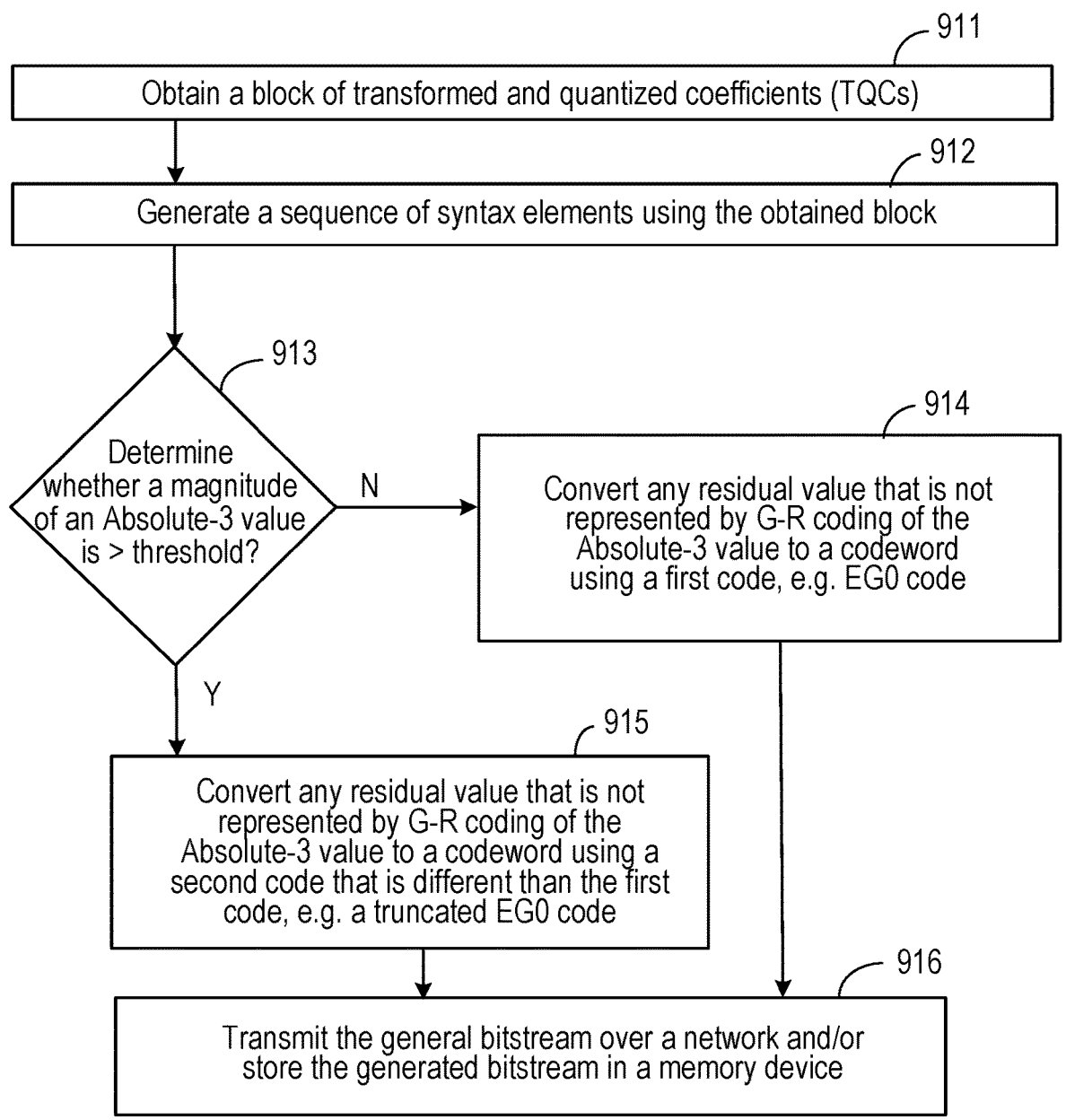
FIG. 9 is a flow diagram illustrating one configuration of a method for coding using a first Golomb-Rice and/or EG (Exponential-Golomb) coding based technique on an electronic device.

FIG. 9 is a flow diagram illustrating one configuration of a method for coding using a first Golomb-Rice and/or EG coding based technique on an electronic device.

In block 911, the electronic device 821 obtains a block of transformed and quantized coefficients (TQCs). In block 912, the electronic device 821 generates a sequence of syntax elements using the obtained block.

In diamond 913, the electronic device 821 determines whether a magnitude of an Absolute-3 value is greater than a threshold. If the magnitude is not greater than the threshold in diamond 913, then in block 914 the electronic device 821 converts any residual value that is not represented by G-R coding of the Absolute-3 value to a codeword using a first code. In an example, the first code comprises EG0 code.

If the magnitude is greater than the threshold in diamond 913, then in block 915 the electronic device 821 converts any residual value that is not represented by G-R coding of the Absolute-3 value to a codeword using a second code that is different than the first code. In an example, the second code comprises a truncated EG0 code.

In an example, if the second code is used, the electronic device 821 may set a high throughput mode indicator, e.g. an HT flag, to a value of 1 (which of course may include changing a default value of the HT flag or leaving the HT flag at a default value depending on design preference).

The electronic device 821 transmits the generated bitstream over a network and/or stores the generated bitstream in a memory device in block 916.

An example of a truncated EG0 code is shown in FIG. 10. In the example of FIG. 10, the EG0 code is truncated when the input value is greater than 254. The longest codeword length using the truncated EG0 table is 24 bits, which is shorter than the longest codeword length using an EG0 table (29 bits). The suffix showing 15 "x" indications can specify any value in the range of 255 to 33022. For example, suffix value 000000000000000 indicates 255, suffix value 000000000000001 indicates 256, and so on, with suffix value 111111111111111 indicating 33022.

Figure 11:
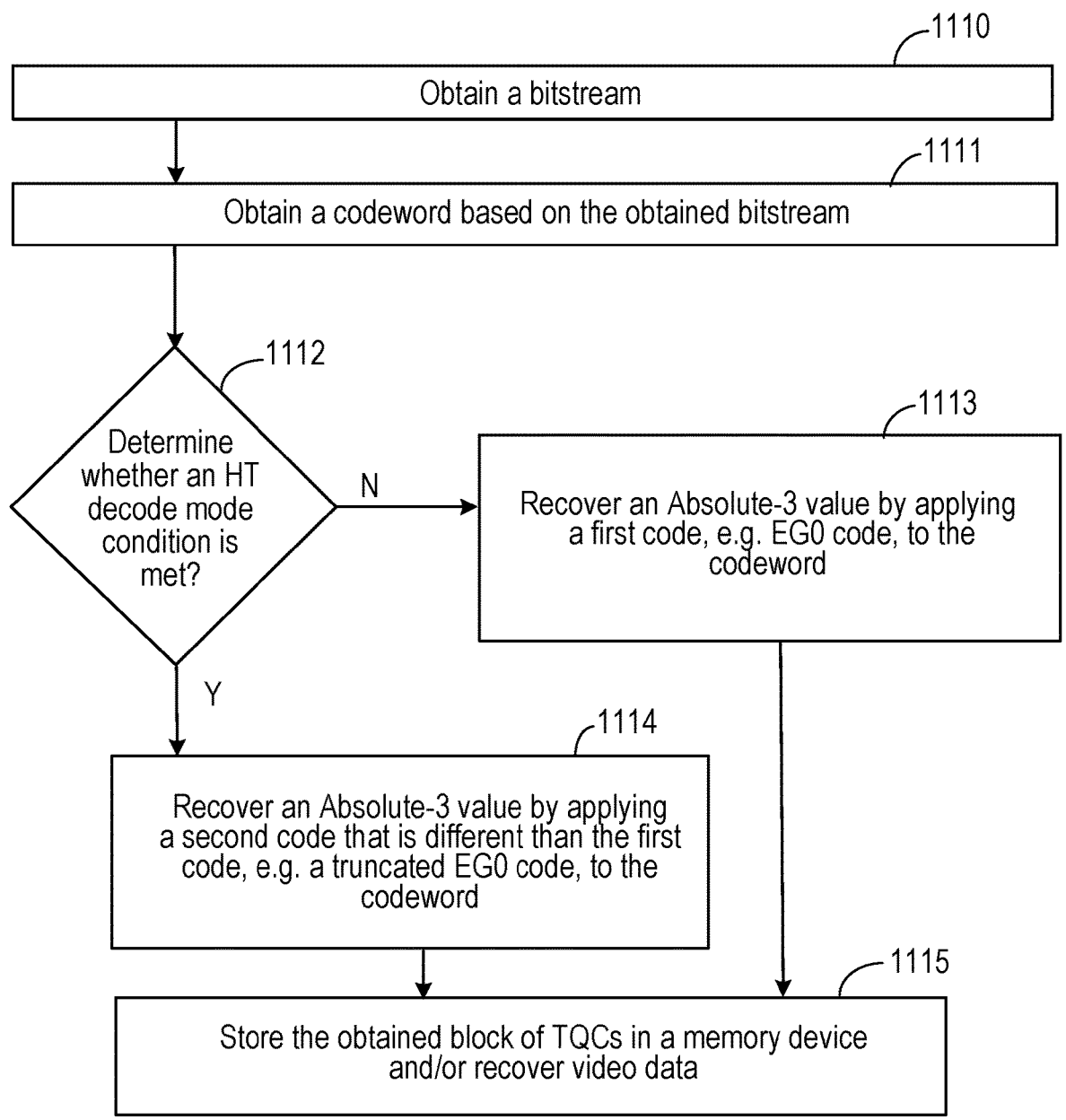
FIG. 11 is a flow diagram illustrating one configuration of a method for coding using the first Golomb-Rice and/or EG coding based technique on an electronic device at the decode-side.

FIG. 11 is a flow diagram illustrating one configuration of a method for coding using the first Golomb-Rice and/or EG coding based technique on an electronic device at the decode-side.

In block 1110, the electronic device 822 obtains a bitstream. In block 1111, the electronic device 822 obtains a codeword from the obtained bitstream.

In diamond 1112, the electronic device 822 determines whether a high throughput decode mode condition is met. In an example, the determination may include checking a header, such as a slice header, corresponding to the received bitstream. Checking the header may further comprise checking a slice header corresponding to the obtained bit stream for a value of a high throughput decode mode indicator. If the condition is not met in diamond 1112, then in block 1113 the electronic device 822 recovers an Absolute-3 value by applying a first code, e.g. EG0 code, to the codeword.

If the condition is met in diamond 1112, then in block 1114 the electronic device 822 recovers an Absolute-3 value by applying a second code that is different than the first code, e.g. a truncated EG0 code, to the codeword. The electronic device 822 may store an obtained block of TQCs in a memory device and/or may recover video data in block 1115.

In an example, G-R coding is bypassed for each Absolute-3 value having a corresponding current Rice parameter equal to 4. In an example, EG4 (4th order) coding is used for the Absolute-3 values that are not processed using G-R coding. The G-R code table corresponding to Rice parameter 4 may not be stored in an example, reducing the memory footprint for G-R code tables from 181 bytes to 101 bytes.

Figure 12:
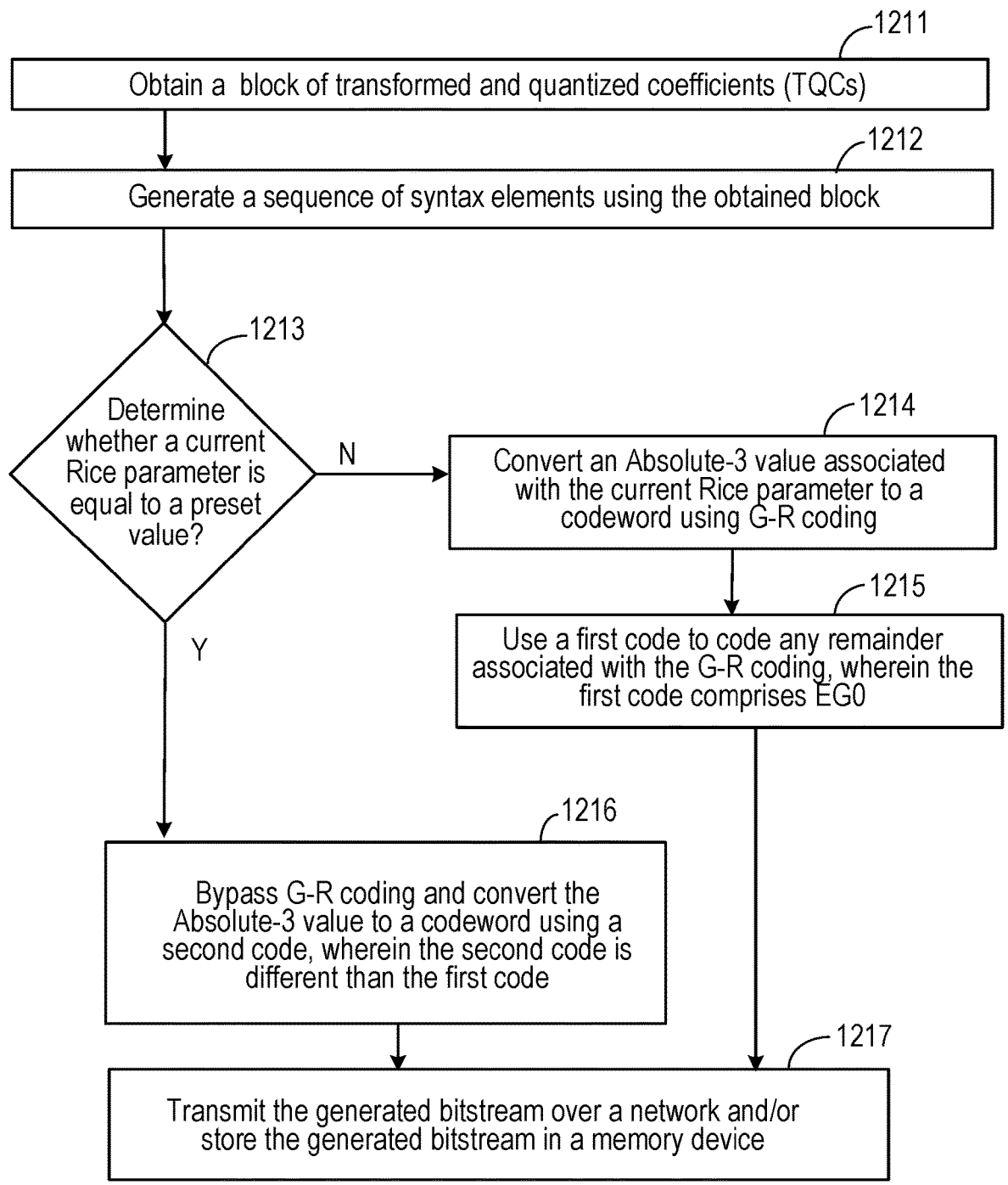
FIG. 12 is a flow diagram illustrating one configuration of a method for coding using a second Golomb-Rice and/or EG coding based technique on an electronic device.

FIG. 12 is a flow diagram illustrating one configuration of a method for coding using a second Golomb-Rice and/or EG coding based technique on an electronic device.

In block 1211, the electronic device 821 obtains a block of transformed and quantized coefficients (TQCs). In block 1212, the electronic device 821 generates a sequence of syntax elements using the obtained block.

In diamond 1213, the electronic device 821 determines whether a current Rice parameter corresponding to an Absolute-3 value is equal to a preset value. If the current Rice parameter does not correspond to the preset value in diamond 1213, then in block 1214 the electronic device 821 converts the Absolute-3 value to a codeword using G-R coding. In block 1215, the electronic device 821 uses a first code to code any remainder associated with the G-R coding.

If the current Rice parameter does correspond to the preset value in diamond 1213, then in block 1216 the electronic device 821 bypasses G-R coding for the Absolute-3 value and converts the Absolute-3 value to a codeword using a second code, wherein the second code is different than the first code. The electronic device 821 transmits the generated bitstream over a network and/or stores the generated bitstream in a memory device in block 1217.

In an example, if the second code is used, the electronic device 821 may set a high throughput mode indicator, e.g. an HT flag, to a value of 1 (which of course may include changing a default value of the HT flag or leaving the HT flag at a default value depending on design preference).

Figure 13:
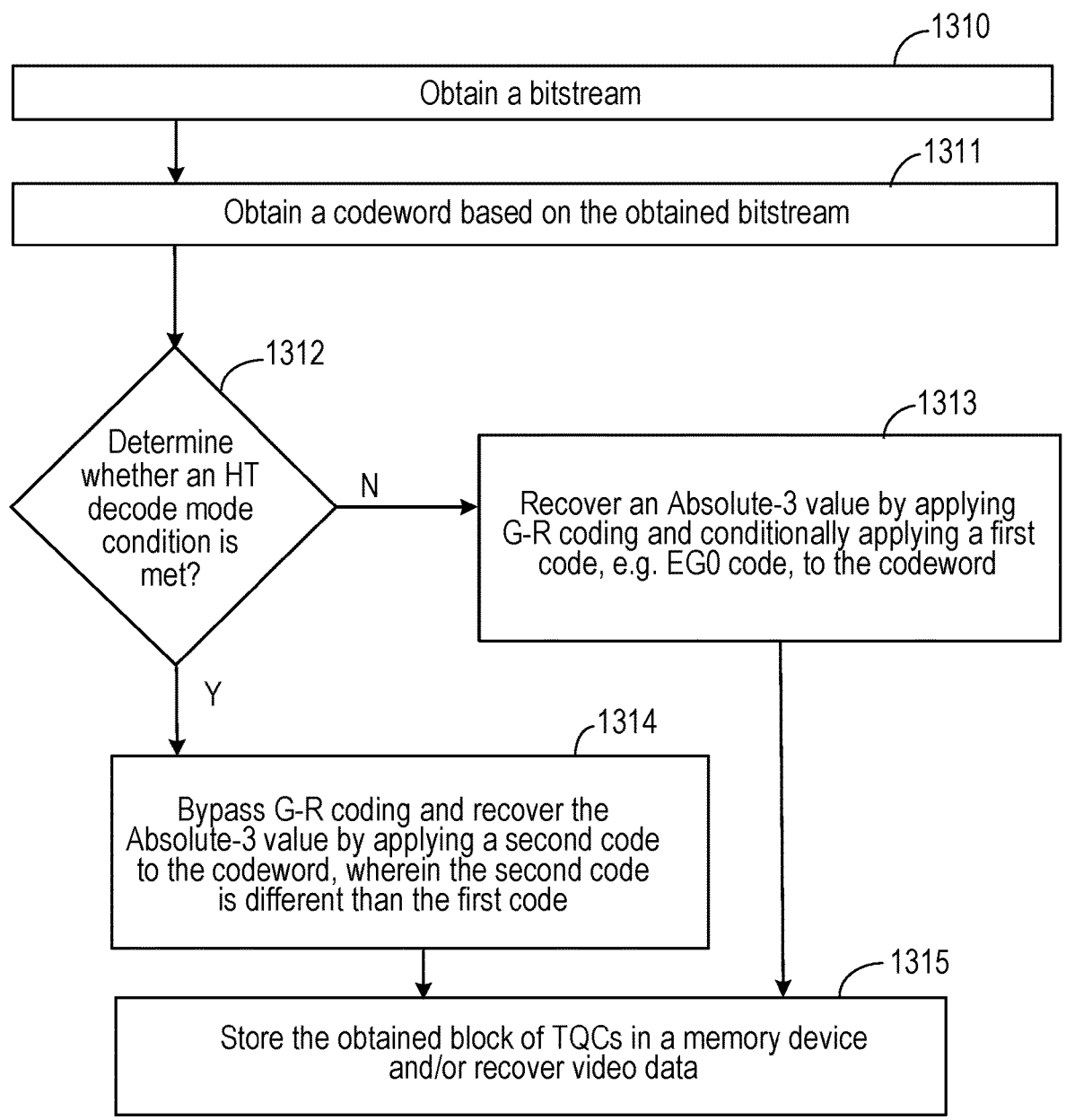
FIG. 13 is a flow diagram illustrating one configuration of a method for coding using the second Golomb-Rice and/or EG coding based technique on an electronic device at the decode-side.

FIG. 13 is a flow diagram illustrating one configuration of a method for coding using the second Golomb-Rice and/or EG coding based technique on an electronic device at the decode-side.

In block 1310, the electronic device 822 obtains a bitstream. In block 1311, the electronic device 822 obtains a codeword from the obtained bitstream.

In diamond 1312, the electronic device 822 determines whether a high throughput decode mode condition is met. In an example, the determination may include checking a header, such as a slice header, corresponding to the received bitstream. Checking the header may further comprise checking a slice header corresponding to the obtained bit stream for a value of a high throughput decode mode indicator. If the condition is not met in diamond 1312, then in block 1313 the electronic device 822 recovers an Absolute-3 value by applying G-R coding and conditionally applying a first code, e.g. EG0 code, to the codeword.

If the condition is met in diamond 1312, then in block 1314 the electronic device 822 recovers an Absolute-3 value by bypassing G-R coding and applying a second code that is different than the first code to the codeword. The electronic device 822 may store an obtained block of TQCs in a memory device and/or may recover video data in block 1315. In an example, EGk coding is adaptively employed for an Absolute-3 value according to a corresponding current Rice parameter for that Absolute-3 value. In an example, EG0 is employed for Absolute-3 values having a corresponding current Rice parameter equal to zero or one. EG1 is employed for Absolute-3 values having a corresponding current Rice parameter equal to 2 or 3. EG2 is employed for Absolute-3 values having a corresponding current Rice parameter equal to 4.

Figure 14:
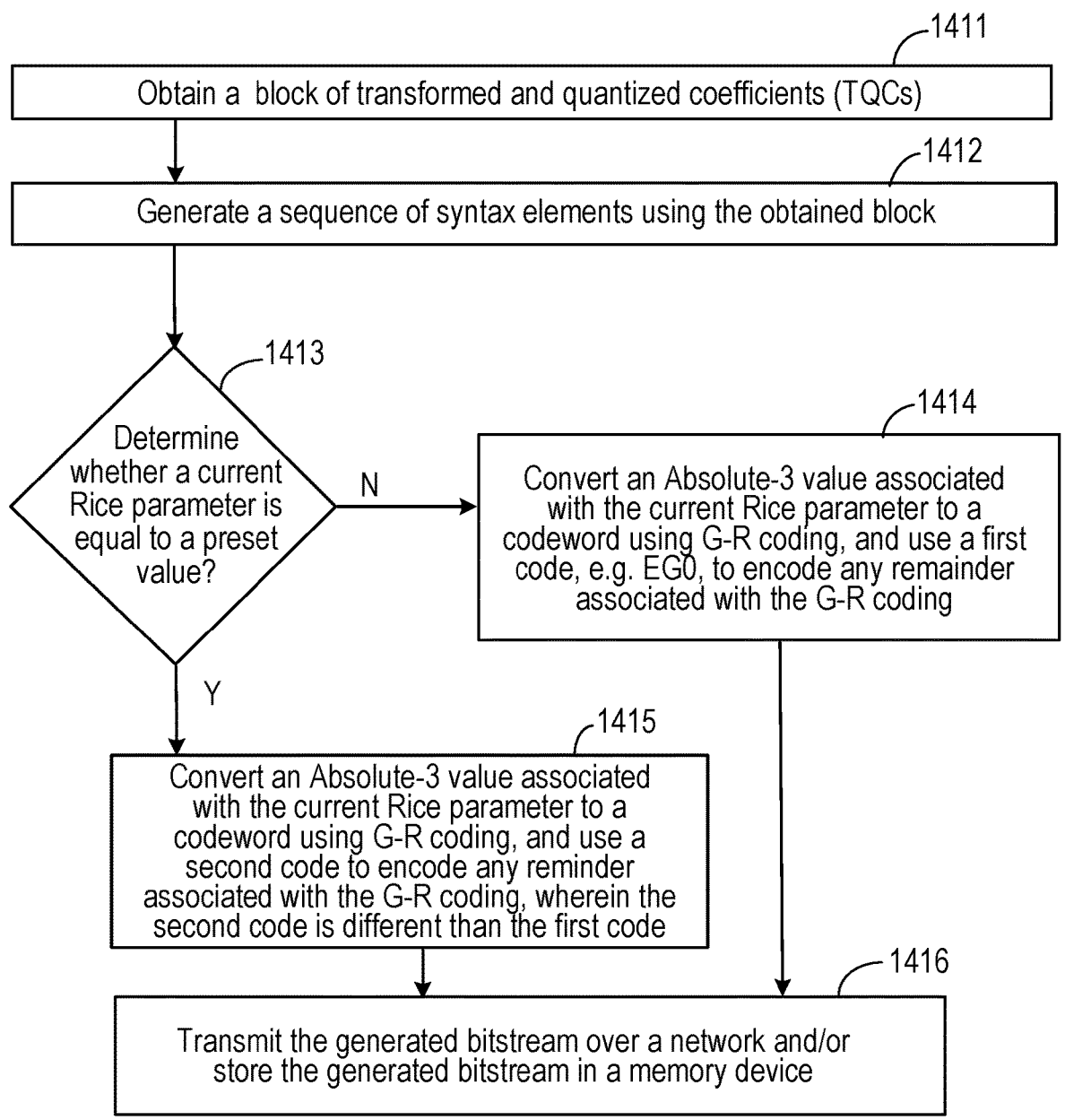
FIG. 14 is a flow diagram illustrating one configuration of a method for coding using a third Golomb-Rice and/or EG coding based technique on an electronic device.

FIG. 14 is a flow diagram illustrating one configuration of a method for coding using a third Golomb-Rice and/or EG coding based technique on an electronic device.

In block 1411, the electronic device 821 obtains a block of transformed and quantized coefficients (TQCs). In block 1412, the electronic device 821 generates a sequence of syntax elements using the obtained block.

In diamond 1413, the electronic device 821 determines whether a current Rice parameter is equal to a preset value. If the current Rice parameter is not equal to the preset value in diamond 1413, then in block 1414 the electronic device 821 converts an Absolute-3 value associated with the current Rice parameter to a codeword using G-R coding, and uses a first code to encode any remainder associated with G-R coding, wherein the first code may comprise EG0.

If the current Rice parameter is equal to the preset value in diamond 1413, then in block 1415 the electronic device 821 converts an Absolute-3 value associated with the current Rice parameter to a codeword using G-R coding, and uses a second code to encode any remainder associated with the G-R coding, wherein the second code is different than the first code. The electronic device 821 transmits the generated bitstream over a network and/or stores the generated bitstream in a memory device in block 1416.

In an example, if the second code is used, the electronic device 821 may set a high throughput mode indicator, e.g. an HT flag, to a value of 1 (which of course may include changing a default value of the HT flag or leaving the HT flag at a default value depending on design preference).

Figure 15:
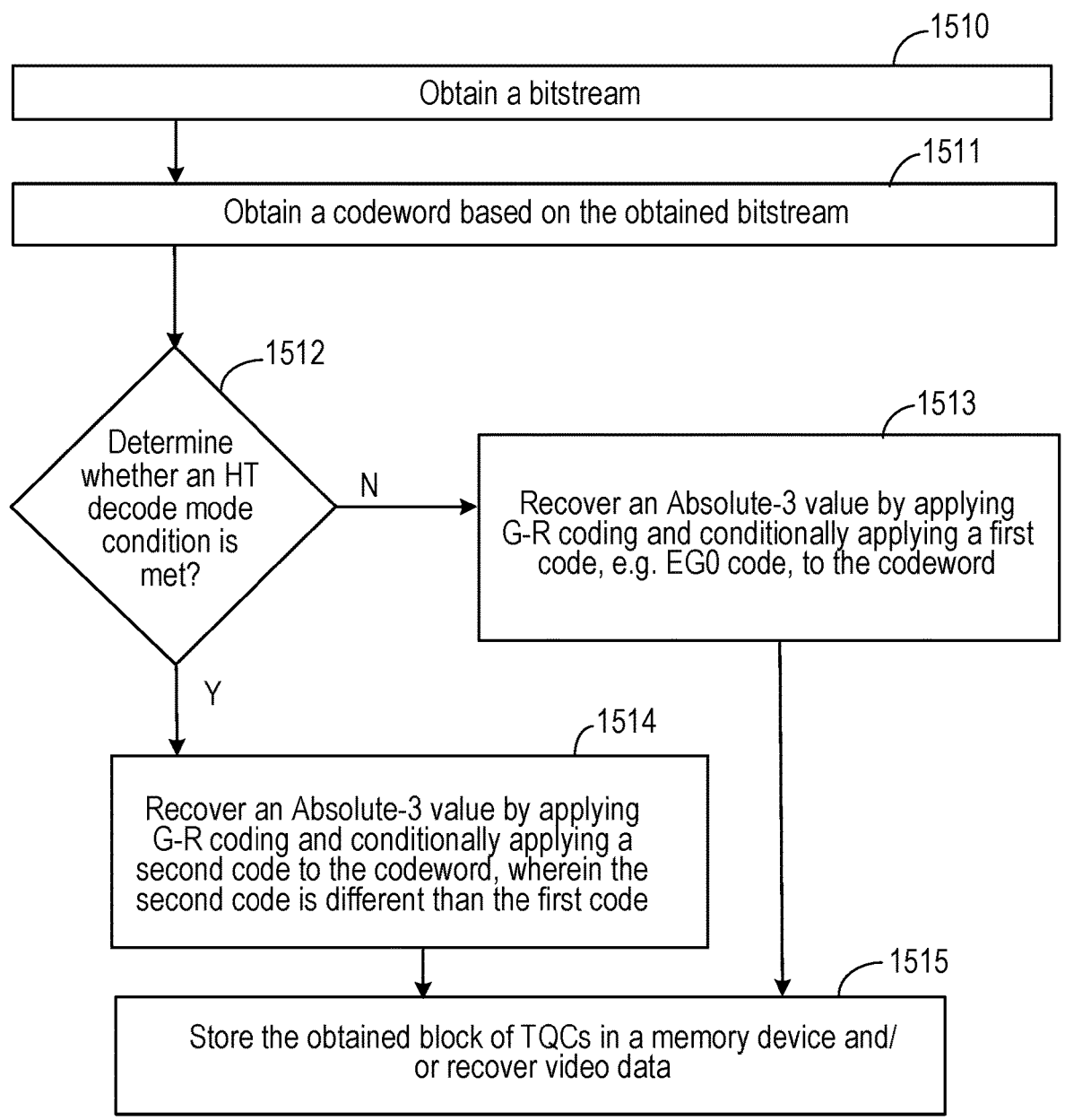
FIG. 15 is a flow diagram illustrating one configuration of a method for coding using the third Golomb-Rice and/or EG coding based technique on an electronic device at the decode-side.

FIG. 15 is a flow diagram illustrating one configuration of a method for coding using the third Golomb-Rice and/or EG coding based technique on an electronic device at the decode-side In block 1510, the electronic device 822 obtains a bitstream. In block 1511, the electronic device 822 obtains a codeword from the obtained bitstream.

In diamond 1512, the electronic device 822 determines whether a high throughput decode mode condition is met. In an example, the determination may include checking a header, such as a slice header, corresponding to the received bitstream. Checking the header may further comprise checking a slice header corresponding to the obtained bit stream for a value of a high throughput decode mode indicator. If the condition is not met in diamond 1512, then in block 1513 the electronic device 822 recovers an Absolute-3 value by applying G-R coding and conditionally applying a first code, e.g. EG0 code, to the codeword.

If the condition is met in diamond 1512, then in block 1514 the electronic device 822 recovers an Absolute-3 value by applying G-R coding and conditionally applying a second code that is different than the first code to the codeword. The electronic device 822 may store an obtained block of TQCs in a memory device and/or may recover video data in block 1515.

(Shared Context Modeling for Last Position Coding for CABAC in HEVC)

By way of background, known CABAC based encoding may utilize context models for arithmetic coding. For coding last position information, known CABAC utilizes thirty context models for luma. These thirty context models, namely 0.sub.1-14.sub.1 and 0.sub.2-14.sub.2, are shown in FIG. 16. TU4, TU8, TU16 and TU32 indicate 4.times.4, 8.times.8, 16.times.16 and 32.times.32 transform. The context models 0.sub.1-14.sub.1 are used to code Pos_X information of the last position information for luma, while the context models 0.sub.2-14.sub.2 are used to code Pos_Y information of the last position information for luma. The context model selection table 1610 is used for Pos_X, while the context model selection table 1611 is used for Pos_Y.

Figure 17:
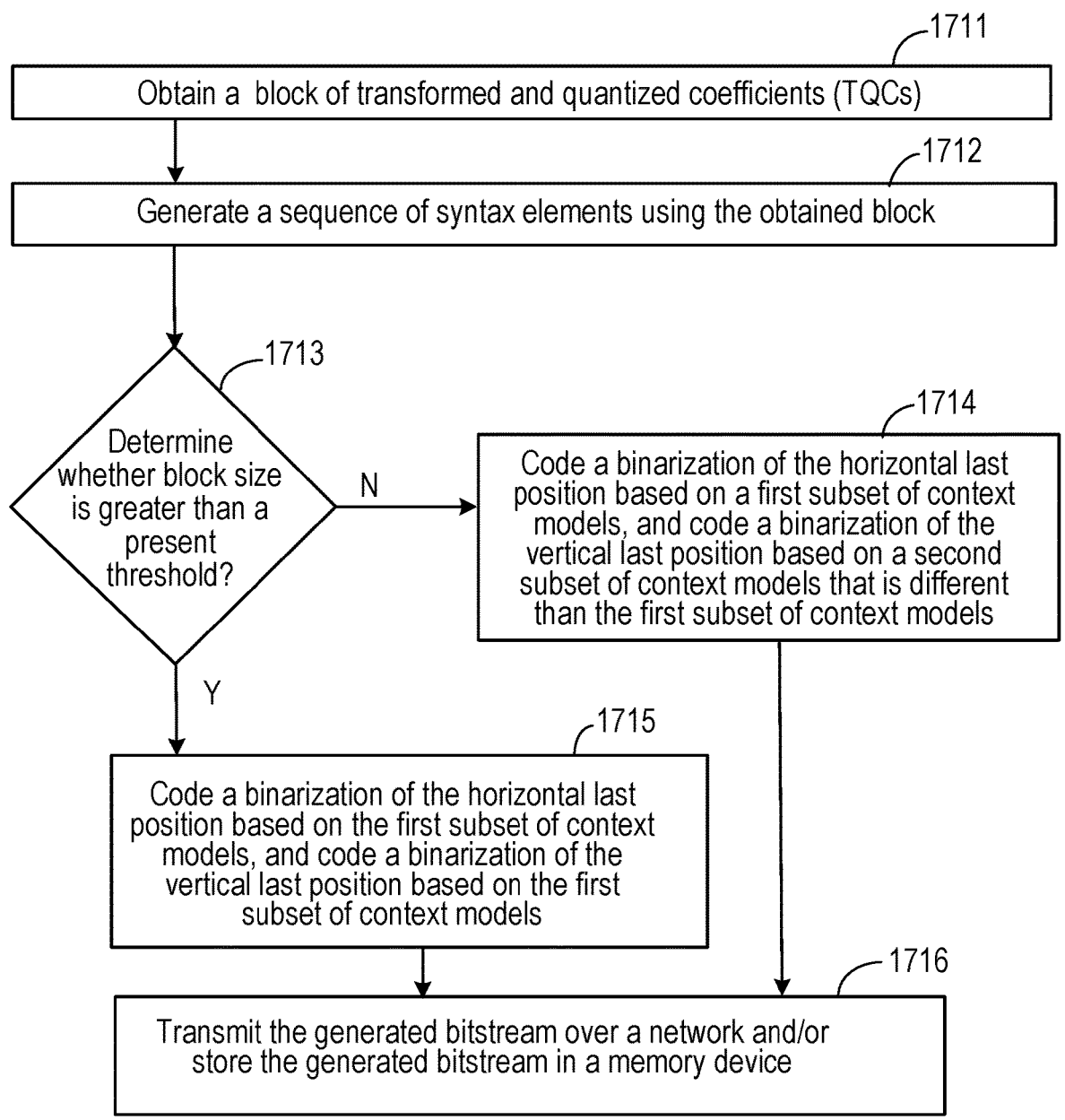
FIG. 17 is a flow diagram illustrating one configuration of a method for shared context modeling for last position coding on an electronic device.

FIG. 17 is a flow diagram illustrating one configuration of a method for shared context modeling for last position coding on an electronic device.

In block 1711, the electronic device 821 obtains a block of transformed and quantized coefficients (TQCs). In block 1712, the electronic device 821 generates a sequence of syntax elements using the obtained block.

In diamond 1713, the electronic device 821 determines whether a block size is greater than a preset threshold. In an example, the electronic device 821 determines whether vertical block size is greater than the preset threshold. If the block size is not greater than the preset threshold in diamond 1713, then in block 1714 the electronic device 821 codes a binarization of the horizontal last position (Pos_X) based on a first subset of context models and codes a binarization of the vertical last position (Pos_Y) based on a second different subset of context models that is different than the first subset of context models.

If block size is greater than the preset threshold in diamond 1713, then in block 1715 the electronic device 821 codes a binarization of the horizontal last position based on the first subset of context models and codes a binarization of the vertical last position based on the first subset of context models.

In an example, if the coding of the binarization of the vertical last position is based on the first subset of context models, the electronic device 821 may set a shared context model mode indicator, e.g. an shared context model mode flag, to a value of 1 (which of course may include changing a default value of the shared context model mode flag or leaving the shared context model mode flag at a default value depending on design preference).

The electronic device 821 transmits the generated bitstream over a network and/or stores the generated bitstream in a memory device in block 1716.

FIG. 18 illustrates coding tables that may be utilized in an example utilizing the configuration described in FIG. 17.

The context model selection table 1810 is used for Pos_X, while the context model selection table 1811 is used for Pos_Y. In the example illustrated by the tables 1810 and 1811, the preset threshold is 8. In the example of FIG. 18, there are twenty one context models, instead of thirty context models (fifteen context models for Pos_X and six context models for Pos_Y).

Figure 19:
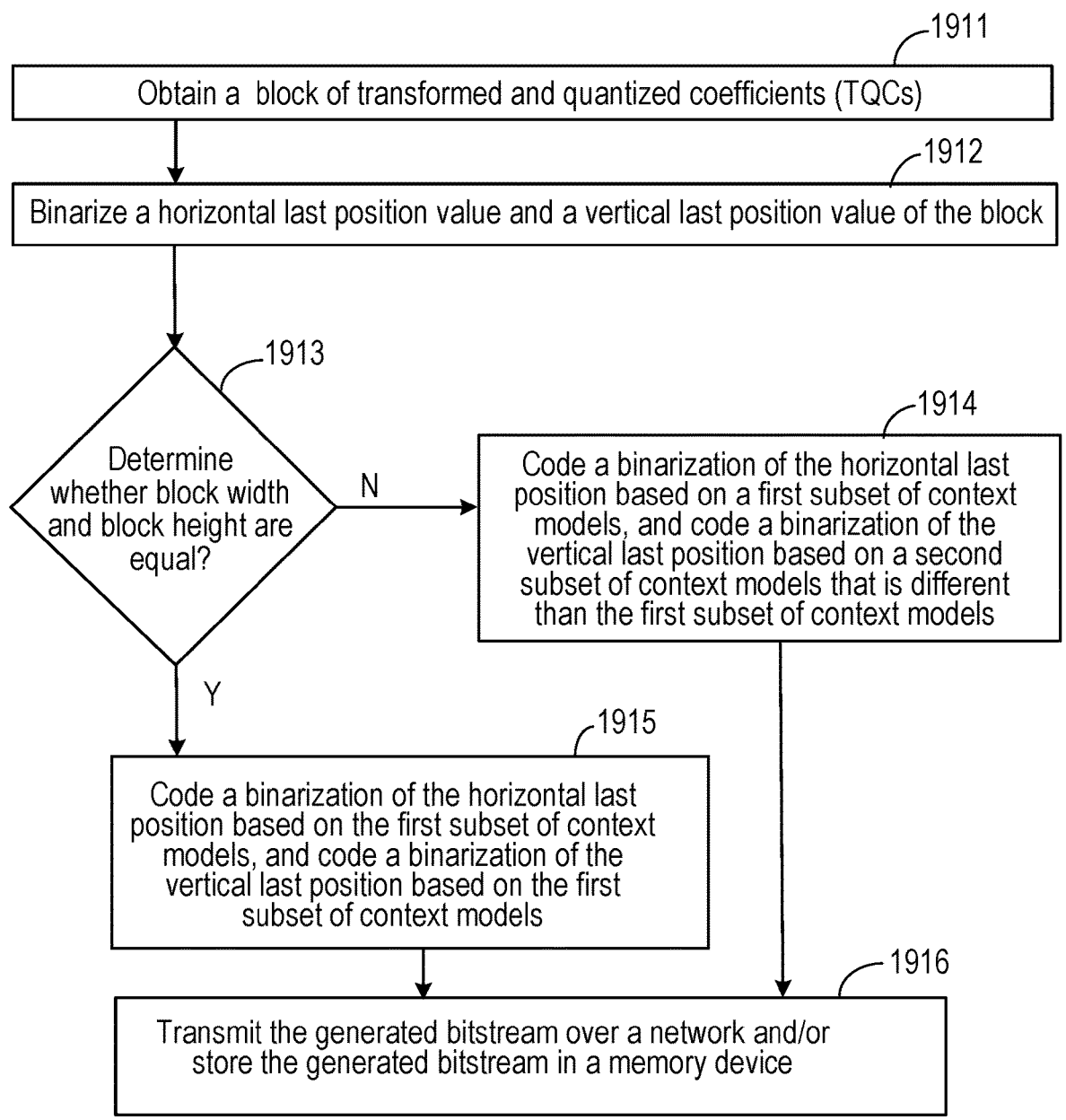
FIG. 19 is a flow diagram illustrating another configuration of a method for shared context modeling for last position coding on an electronic device.

FIG. 19 is a flow diagram illustrating another configuration of a method for shared context modeling for last position coding on an electronic device.

In block 1911, the electronic device 821 obtains a block of transformed and quantized coefficients (TQCs). In block 1912, the electronic device 821 generates a sequence of syntax elements using the obtained block.

In diamond 1913, the electronic device 821 determines whether block width and block height are equal. If the block width and block height are not equal in diamond 1913, then in block 1914 the electronic device 821 codes a binarization of the horizontal last position (Pos_X) based on a first subset of context models and codes a binarization of the vertical last position (Pos_Y) based on a second different subset of context models that is different than the first subset of context models.

If block width and block height are equal in diamond 1913, then in block 1915 the electronic device 821 codes a binarization of the horizontal last position based on the first subset of context models and codes a binarization of the vertical last position based on the first subset of context models.

In an example, if the coding of the binarization of the vertical last position is based on the first subset of context models, the electronic device 821 may set a shared context model mode indicator, e.g. an shared context model mode flag, to a value of 1 (which of course may include changing a default value of the shared context model mode flag or leaving the shared context model mode flag at a default value depending on design preference).

The electronic device 821 transmits the generated bitstream over a network and/or stores the generated bitstream in a memory device in block 1916.

FIG. 20 illustrates coding tables that may be utilized in an example utilizing the configuration described in FIG. 19.

The context model selection table 2010 is used for Pos_X when block width and block height are equal, while the context model selection table 2011 is used for Pos_Y when block width and block height are equal. In an example, the context model selection tables 1610 and 1611 (FIG. 16) may be used when block width and block height are not equal.

Figure 21:
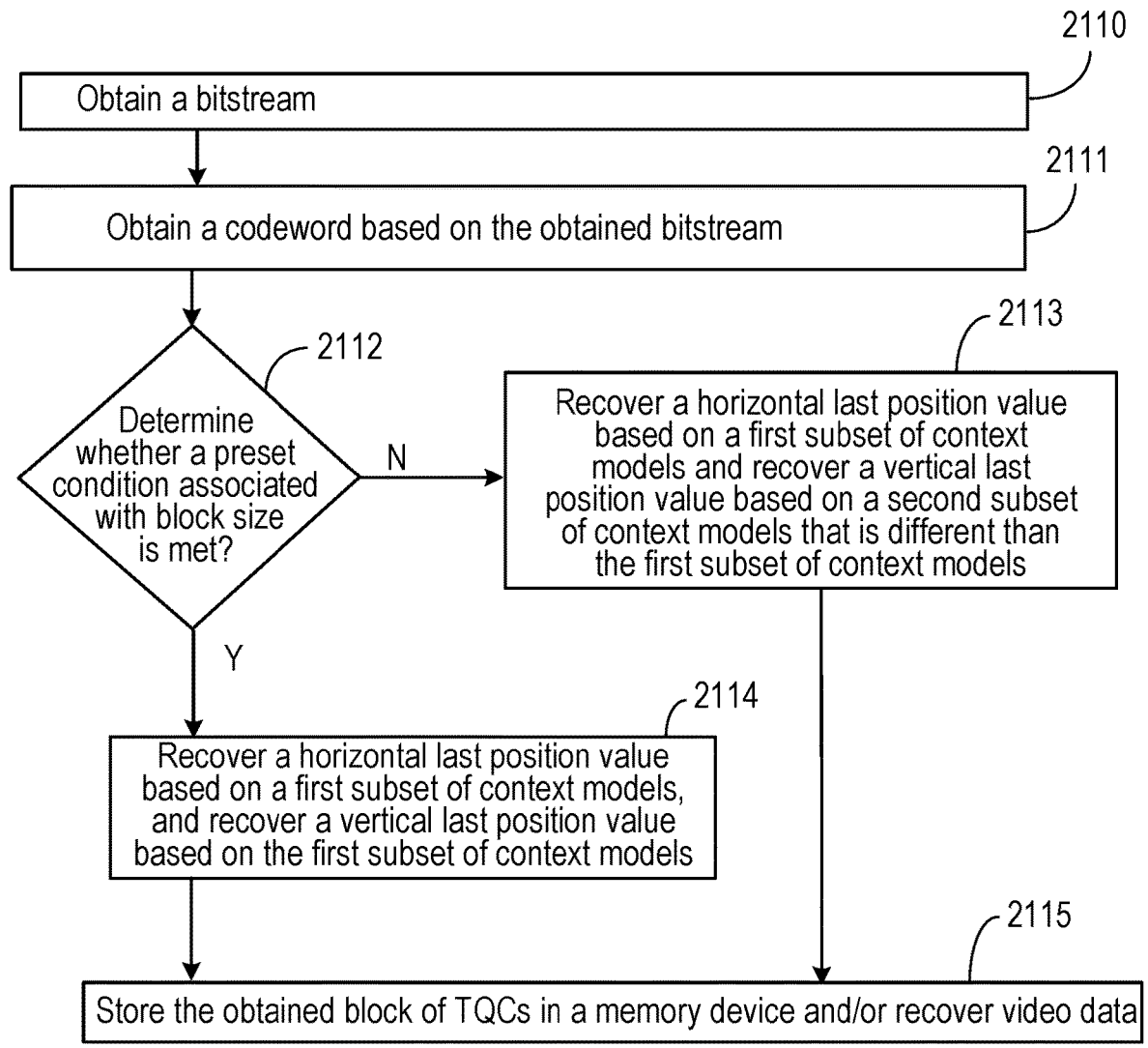
FIG. 21 is a flow diagram illustrating one configuration of a method for shared context modeling for last position coding on an electronic device at the decode-side.

FIG. 21 is a flow diagram illustrating one configuration of a method for shared context modeling for last position coding on an electronic device at the decode-side.

In block 2110, the electronic device 822 obtains a bitstream. In block 2111, the electronic device 822 obtains a codeword from the obtained bitstream.

In diamond 2112, the electronic device 822 determines whether a preset condition associated with block size is met. In an example, the determination may include checking a header, such as a slice header, corresponding to the received bitstream. Checking the header may further comprise checking a slice header corresponding to the obtained bit stream for a value of a shared context model mode indicator. If the preset condition is not met in diamond 2112, then in block 2113 the electronic device 822 recovers a horizontal last position value based on a first subset of context models and recovers a vertical last position value based on a second subset of context models that is different than the first subset of context models.

If the preset condition is met in diamond 2112, then in block 2114 the electronic device 822 recovers a horizontal last position value based on a first subset of context models and recovers a vertical last position value based on the first subset of context models. The electronic device 822 may store an obtained block of TQCs in a memory device and/or may recover video data in block 2115.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. One or more of the operations, processes, and/or methods described herein may be performed by an apparatus, a device, and/or a system substantially similar to those as described herein and with reference to the illustrated figures.

A processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a conventional rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long as the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

What is claimed is:

1. A method for encoding transform coefficients representing a block of an image, comprising:
    obtaining data associated with a target transform coefficient to be encoded;
    generating a plurality of flags indicating whether the target transform coefficient is greater than a particular value;
    deriving a difference between the target transform coefficient and the particular value;
    deriving a Rice parameter for the target transform coefficient;
    generating binary data associated with magnitude of the difference between the target transform coefficient and the particular value based on a combination of a Rice code corresponding to the Rice parameter and a first or a second code wherein the first code is a k-th order exponential Golomb code; and
    generating, based on the binary data, a bitstream representing a coded image, the bitstream comprising: (i) a first syntax element, wherein a combination of the plurality of flags and the first syntax element indicates the magnitude of the transform coefficient, and (ii) an indicator indicative of whether the first or the second code is used in combination with the Rice code, wherein the indicator is a flag that is different from the Rice parameter.

2. The method of claim 1, wherein the value k of the k-th order exponential Golomb code is determined based on the Rice parameter.

3. The method of claim 1, wherein generating the bitstream comprises encoding the binary data using arithmetic encoding.

4. The method of claim 1, wherein generating the binary data comprises:
    generating, from the obtained data, a second parameter, different from the Rice parameter, the second parameter being associated with the magnitude of the target transform coefficient.

5. The method of claim 4, further comprising converting the second parameter to the binary data based on the combination of (i) the Rice code and (ii) the first or the second code.

* * * * *